United States Patent [19]
Torii et al.

[11] Patent Number: 5,972,862
[45] Date of Patent: Oct. 26, 1999

[54] CLEANING LIQUID FOR SEMICONDUCTOR DEVICES

[75] Inventors: Yoshimi Torii, Dallas, Tex.; Shunji Sasabe, Saitama-ken, Japan; Masayuki Kojima; Kazuhisa Usuami, both of Tokyo, Japan; Takafumi Tokunaga, Saitama-ken, Japan; Kazusato Hara; Yoshikazu Ohira, both of Tokyo, Japan; Tsuyoshi Matsui; Hideto Gotoh, both of Dallas, Tex.; Tetsuo Aoyama, Niigata-ken, Japan; Ryuji Hasemi, Niigata-ken, Japan; Hidetoshi Ikeda, Niigata-ken, Japan; Fukusaburo Ishihara; Ryuji Sotoaka, both of Ibaraki-ken, Japan

[73] Assignee: Mitsubishi Gas Chemical, Tokyo, Japan

[21] Appl. No.: 08/901,475

[22] Filed: Jul. 28, 1997

[30] Foreign Application Priority Data

Aug. 9, 1996 [JP] Japan .................................. 8-211217

[51] Int. Cl.$^6$ ................................. C11D 1/62; C11D 7/08; C11D 3/44

[52] U.S. Cl. ........................ 510/175; 510/176; 510/178; 510/181; 510/182; 510/201; 510/204; 510/245; 510/253; 510/254; 510/256; 510/259; 510/263; 510/504; 510/510; 134/1.2; 134/1.3; 134/3; 483/905; 483/906; 483/974

[58] Field of Search .................................... 483/905, 906, 483/974; 510/175, 176, 178, 181, 182, 201, 204, 245, 253, 254, 256, 259, 263, 504, 510; 134/1.2, 1.3, 3

[56] References Cited

U.S. PATENT DOCUMENTS

| | | |
|---|---|---|
| 4,125,005 | 11/1978 | Vander Mey . |
| 4,215,005 | 7/1980 | Vander Mey ........................... 252/153 |
| 4,343,677 | 8/1982 | Kinsbron et al. ....................... 156/643 |
| 4,536,336 | 8/1985 | Kishi ..................... 260/351.1 |
| 4,567,946 | 2/1986 | Watanabe ................. 166/307 |
| 5,571,447 | 11/1996 | Ward et al. ............................. 510/206 |
| 5,630,904 | 5/1997 | Aoyama et al. ......................... 438/669 |
| 5,633,111 | 5/1997 | Yoshimoto et al. .................... 430/165 |
| 5,676,760 | 10/1997 | Aoki et al. ................. 134/1.3 |
| 5,817,549 | 10/1998 | Yamazaki et al. ...................... 438/166 |

FOREIGN PATENT DOCUMENTS

| | | |
|---|---|---|
| 0 496 229 A2 | 7/1992 | European Pat. Off. . |
| 0 596 515 | 5/1994 | European Pat. Off. . |
| 0662705 | 12/1994 | European Pat. Off. . |
| 0 662 705 A2 | 7/1995 | European Pat. Off. . |
| 0 680 078 | 11/1995 | European Pat. Off. . |
| 0 773 480 A1 | 5/1997 | European Pat. Off. . |

OTHER PUBLICATIONS

Patent Abstracts of Japan, vol. 11, No. 124 (C–416), Apr. 17, 1987, of JP 61 263921 A, Nov. 21, 1986.

Patent Abstracts of Japan, vol. 12, No. 357 (E–662), Sep. 26, 1988, of JP 63 114128 A, May 19, 1998.

Patent Abstracts of Japan, vol. 16, No. 295 (C–957), Jun. 30, 1992, of JP 04 080297 A, Mar. 13, 1992.

*Primary Examiner*—Mark Kopec
*Assistant Examiner*—Charles Boyer
*Attorney, Agent, or Firm*—Frishauf, Holtz, Goodman, Langer & Chick, P.C.

[57] ABSTRACT

There is disclosed a cleaning liquid for producing a semiconductor device which comprises (A) fluorine-containing compound; (B) water-soluble or water-miscible organic solvent; and (C) inorganic acid and/or organic acid, optionally, further comprises (D) quaternary ammonium salt or (D') a specific organic carboxylic acid ammonium salt and/or an organic carboxylic acid amine salt; as well as a process for producing a semiconductor device by forming a resist pattern on a substrate equipped on the surface with an insulating film layer or a metallic electroconductive layer, forming a via hole or electric wiring by dry etching, removing the resist pattern by ashing treatment with oxygen plasma; and effecting an cleaning treatment with the above cleaning liquid. The above cleaning liquid and production process can readily remove the deposit polymer formed in the case of dry etching without impairing metallic film and insulating film.

33 Claims, 3 Drawing Sheets

CLEANING LIQUID FOR SEMICONDUCTOR DEVICES

BACKGROUND OF THE INVENTION

1. Field of the Invention

The present invention relates to a cleaning liquid having extremely low corrosiveness to materials such as a metallic film and SOG (Spin On Glass) film and to a process for producing a high quality and highly reliable semiconductor device, said cleaning liquid being suitably used for e.g. removing a deposit polymer formed in the case of dry etching in a semiconductor device production process using silicon, specifically (1) for removing a deposit polymer (deposit protection film) formed and stuck inside or around a via hole (connective hole formed in an insulating film for connecting between a metallic electroconductive film layer formed for wiring in a lower layer of an insulating film and a metallic electroconductive film layer formed in the upper layer of the aforesaid insulating film), which via hole being formed particularly in the insulating layer (interlaminar insulating film); and (2) for removing a deposit polymer formed and stuck to a side wall, etc. after wiring of a metallic electroconductive layer.

2. Description of the Related Arts

In general, lithography has heretofore been adopted in the production of a semiconductor device such as LC and LSI. In the case of producing a semiconductor device by lithography, there are adopted a series of steps of forming an insulating film such as silicon oxide film on a substrate such as a silicon wafer and an electroconductive film such as a metallic film for wiring as electroconduction; uniformly applying a photoresist on the surfaces thereof to provide a photosensitive layer; applying a selective exposure and developing treatment to form a desired resist pattern; subjecting thin films in the lower layer to selective etching treatment using the resist as a mask to form a circuit pattern; and then completely removing the resultant resist pattern.

With recent progress in high integration of semiconductor devices, there is required a pattern formation with an accuracy of a half micron to a quarter micron. Thus, with the progress of such fine processing, the dry etching becomes prevalent in the above-mentioned selective etching treatment and the removal of the resist pattern is carried out increasingly by an ashing treatment with oxygen plasma.

There is known, however, in such a dry etching treatment, the formation of a deposit polymer due to the dry etching gas, resist, processed film and the like in the perimeter of the formed pattern. Such a deposit polymer, when being left inside and around via holes, brings about such unfavorable situations as high electric resistance and short circuit. Accordingly, it is extremely important to remove the deposit polymer in order to obtain a high quality semiconductor device.

The removal of a slight amount of the deposit polymer can be achieved by the combinational use of an ashing treatment and an organic solvent for resist peeling such as an alkaline or acidic solvent. The removal of a large amount thereof can be achieved by a cleaning treatment through the use of a treating liquid containing hydrofluoric acid or containing hydrofluoric acid and ammonium fluoride.

However, such a treatment method by the use of a fluorine compound is useful in the case of using an extremely corrosion resistant insulating film of silicon oxide such as a CVD (Chemical Vapor Deposition)-silicon oxide or a thermal silicon oxide and a relatively corrosion resistant metallic film made of tungsten, titainium, an alloy thereof, titanium/tungsten alloy, titanium nitride or the like, as a lower layer film for the insulating film wherein via holes are formed. Nevertheless, the aforesaid treatment method, when applied to an insulating film of SOG silicon oxide or a metallic film made of aluminium or an aluminum-containing alloy, brings about, for example, a connection failure for the metallic film through via holes by the above-mentioned fluorine compound which corrodes and dissolves the insulating film or the metallic film, thereby completely losing electrical reliability.

In the case where aluminum or an aluminum-containing alloy is subjected to dry etching to form metallic wiring, the deposit polymer is formed and stuck to the side wall of a wiring layer. Such polymer is extremely difficult to remove, and besides an acid is formed by the phenomenon in that radicals and ions in a reaction gas that are incorporated into said deposit polymer are left in the air after the end of the etching treatment, and are reacted with the humidified air. Consequently, the wiring materials are corroded thereby, resulting in an increase in electric resistance and wire breakage, thus causing serious adverse influeneces.

As a method for preventing such corrosion of the wiring materials, a method is put into practice for example, in which said radicals and ions are washed away by carrying out a cleaning treatment with ultrapure water for a long time after the dry etching. In this method, however, it is extremely difficult to completely remove the radicals and ions from the deposit polymer formed and stuck to the side walls and there is always a fear of causing corrosion of the wiring materials. It is therefore indispensable to completely remove the deposit polymer for the purpose of exterminating the corrosion.

In addition, it is difficult to remove the deposit polymer formed in the case of a dry etching treatment for the layer of titanium or tungsten. Although such deposit polymer is removable by a cleaning treatment through the use of a treating liquid containing hydrofluoric acid or containing hydrofluoric acid and ammonium fluoride, a metallic layer made of tungsten, titanium, an alloy thereof, titanium/tungsten alloy, titanium nitride or the like has fair corrosion resistance against a fluorine compound, but has not complete corrosion resistance thereagainst, thereby causing a fear that the electrical reliability is lost by pattern peeling and the like. The deposit polymer, when being allowed to remain unremoved, causes adjacent wirings to come into contact therewith by the accumulated pressure of the film in the next step, thus giving rise to a short circuit and an abnormality of wiring.

SUMMARY OF THE INVENTION

It is an object of the invention to provide, in such circumstances, a cleaning liquid free from causing corrosion of an insulating film and a metallic film for the production of a semiconductor device, and a process for producing a high quality and highly reliable semiconductor device, said cleaning liquid being capable of readily removing a deposit polymer which is formed in the case of dry etching in a semiconductor device production process, especially a deposit polymer formed and stuck inside or around a via hole; and a deposit polymer formed and stuck to a side wall, etc. after wiring of a metallic electroconductive layer.

As a result of intensive research and investigation accumulated by the present inventors in order to achieve the above-mentioned object, it has been found that the deposit polymer formed in the case of dry etching can readily be removed without causing corrosion of insulating films and metallic films by the use of, as a cleaning liquid, an aqueous solution containing a fluorine-containing compound; a water-soluble or water-miscible organic solvent; an inorganic acid or an organic acid; and a specific quaternary ammonium salt or a specific organic carboxylic acid ammonium salt or organic carboxylic acid amine salt as occasion demands. Since it has been made possible to readily remove a deposit polymer formed and stuck inside or around a via hole which polymer has heretofore been difficult to remove and a deposit polymer formed and stuck to a side wall, etc. after wiring of a metallic electroconductive layer, the vicinity of a via hole is freed from pollution and is cleaned in the via hole forming step, thus enabling sufficient connection of metallic wiring. At the same time, it has been found that, since the deposit polymer on the side wall of a metallic electroconductive layer can be removed in the metallic wiring forming step, it is made possible to assure the formation of corrosion-free wiring and obtain a high quality and highly reliable semiconductor device. The present invention has been accomplished on the basis of the aforestated finding and information.

Specifically, the present invention provides
(1) a cleaning liquid in the form of an aqueous solution for producing a semiconductor device which comprises a (A) fluorine-containing compound; a (B) water-soluble or water-miscible organic solvent; and a (C) inorganic acid and/or organic acid;
(2) a cleaning liquid in the form of an aqueous solution for producing a semiconductor device which comprises said (A), (B), (C) and (D) quaternary ammonium salt represented by the general formula (I)

$$[(R^1)_3N-R^2]^+_a X^{a-} \qquad (I)$$

wherein $R^1$ is an alkyl group having 1 to 4 carbon atoms in which three $R^1$ may be the same or different, $R^2$ is an alkyl group or hydroxyalkyl group each having 1 to 4 carbon atoms, and $X^{a-}$ is an inorganic or organic anion in which a is the valency of said anion (hereinafter referred to as cleaning liquid (I));
(3) a cleaning liquid in the form of an aqueous solution for producing a semiconductor device which comprises said (A), (B), (C) and (D') organic carboxylic acid ammonium salt and/or an organic carboxylic acid amine salt represented by the general formula (II)

$$Z\text{-}[COONH_{4-n}(R^3)_n]_m \qquad (II)$$

wherein Z is hydrogen atom or a mono-to-tetra-valent hydrocarbon group having 1 to 18 carbon atoms, $R^3$ is an alkyl group having 1 to 4 carbon atoms or a hydroxyalkyl group having 2 to 4 carbon atoms, n is an integer from 0 to 3, m is an integer from 1 to 4 and a plurality of $R^3$, when present, may be the same or different (hereinafter referred to as cleaning liquid (II));
(4) a process for producing a semiconductor device which comprises the steps of forming a prescribed resist pattern on a semiconductor substrate equipped on the surface thereof with an insulating film layer; forming a via hole by dry etching using said resist pattern as a mask; then removing said resist pattern by effecting an ashing treatment by means of oxygen plasma or a wet treatment by resist-stripper; and thereafter effecting an cleaning treatment by the use of the cleaning liquid as set forth in the above item (1), (2) or (3);
and (5) a process for producing a semiconductor device which comprises the steps of forming a prescribed resist pattern on a semiconductor substrate equipped on the surface thereof with a metallic electroconductive film layer; forming metallic wiring by dry etching using said resist pattern as a mask; then removing said resist pattern by effecting an ashing treatment by means of oxygen plasma or a wet treatment by resist-stripper; and thereafter effecting an cleaning treatment by the use of the cleaning liquid as set forth in the above item (1), (2) or (3)

Figure 1A:
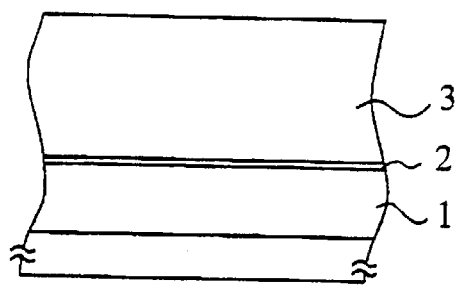
FIG. 1 is a schematic drawing showing the process for producing a semiconductor device in Example 1.

The reference numerals used in the drawings refer to the following:

1: Al—Si—Cu alloy layer
2: TiN layer
3: CVD silicon oxide film
4: Resist layer
5: Deposit polymer
11: CVD silicon oxide film
12: Tin layer
13: Sputtered tungsten layer
14: CVD tungsten layer
15: Tin layer
16: Resist layer
17: Deposit polymer
21: CVD silicon oxide film
22: Sputtered tungsten layer
23: CVD tungsten layer
24: Al—Si—Cu alloy layer
25: TiN layer
26: Resist layer
27: Deposit polymer

DESCRIPTION OF THE PREFERRED EMBODIMENT

A fluorine-containing compound is used as the component (A) in the cleaning liquids of the present invention, which compound is exemplified by hydrofluoric acid, ammonium fluoride, ammonium hydrogen fluoride and ammonium borofluoride.

The fluorine-containing compound as the component (A) in the cleaning liquids of the invention may be used alone or in combination with at least one other. The content thereof is not specifically limited, but is suitably selected according to the situation, usually in the range of 0.1 to 15% by weight. A content thereof less 0.1% by weight is unfavorable because of low removal rate of the deposit polymer, whereas a content thereof more than 15% by weight results in a tendency to corrode the wiring material. Judging from the balance between the removal rate of the deposit polymer and the corrosion suppresion of the wiring material, the content thereof is preferably in the range of 0.5 to 10% by weight.

A water-soluble or water-miscible organic solvent is used each as the component (B) in the cleaning liquids of the invention. Examples of such organic solvent include amides such as formamide; N-methylformide; N,N-dimethylformide; N-N-dimethylacetamide; and N-methylpyrrolidone, lactones such as r-butyrolactone alcohols such as methanol; ethanol; isopropanol; and ethylene glycol, esters such as methyl acetate, ethyl acetate, butyl acetate, methyl lactate, and ethyl lactate, glycols such as ethylene glycol monobutyl ether, diethylene glycol monomethyl ether and diethylene glycol monoethyl ether, and sulfur compounds such as dimethyl sulfoxide and sulfolane.

The organic solvent as the component (B) in the cleaning liquids of the invention may be used alone or in combination with at least one other. The content thereof is not specifically limited, but is suitably selected according to the situation, usually in the range of 1 to 80% by weight. A content thereof less than 1% causes liability to corrosion of the wiring material and a fear of worsening workability because of unreasonably increased viscosity of the cleaning liquid, whereas a content thereof more than 80% by weight results in a tendency to lower the removal rate of the deposit polymer. Judging from the aspects of corrosion suppression of the wiring material, viscosity of the liquid and the removal rate of the deposit polymer, the content thereof is preferably in the range of 5 to 70% by weight.

An inorganic acid and/or an organic acid are used each as the component (C) in the cleaning liquids of the invention. Examples of such inorganic acid include boric acid, phosphoric acid, phosphorous acid, hypophosphorous acid, polyphosphoric acid, sulfuric acid, sulphate, chloric acid, chlorous acid, hypochlorous acid, bromic acid, bromous acid, hypobromous acid, iodic acid, iodous acid, hypoiodous acid, nitric acid and nitrous acid. Among these compounds, boric acid or phosphoric acid is preferably used. Examples of such organic acid include formic acid, acetic acid, propionic acid, butyric acid, isobutyric acid, valeric acid, isovaleric acid, heptanoic acid, lauric acid, palmitic acid, stearic acid, acrylic acid, crotonic acid, methacrylic acid, oxalic acid, malonic acid, maleic acid, succinic acid, adipic acid, azelaic acid, sebacic acid, benzoic acid, toluic acid, phthalic acid, trimellitic acid, pyromellitic acid, benzenesulfonic acid, toluenesulfonic acid, and salicylic acid.

The inorganic acid and/or an organic acid as the component (C) in the cleaning liuqids of the invention may be used alone or in combination with at least one other. The content thereof is not specifically limited, but is suitably selected according to the situation, usually in the range of 0.01 to 5% by weight. A content thereof less than 0.01% by weight is unfavorable because of low removal rate of the deposit polymer, whereas a content thereof more than 5% by weight results in a tendency to corrode the wiring matieral. Judging from the aspects of removal rate of the deposit polymer and the corrosion suppression of the wiring material, the content threreof is preferably in the range of 0.05 to 3% by weight.

In the cleaning liquid (I) according to the present invention, there is used, as the component (D), a quaternary ammonium salt represented by the general formula (I)

  (I)

In the general formula (I), $R^1$ is an alkyl group having 1 to 4 carbon atoms, may be linear or branched and is exemplified by methyl group, ethyl group, n-propyl group, isopropyl group, n-butyl group, isobutyl group, sec-butyl group and tert-butyl group. Three $R^1$ may be the same as or different from one another. $R^2$ is an alkyl group or hydroxyalkyl group each having 1 to 4 carbon atoms, may be linear or branched and is exemplified by those exemplifying the $R^1$. Examples of the hydroxyalkyl group include 2-hydroxyethyl group, 2-hydroxypropyl group, 3-hydroxypropyl group, 2-hydroxybutyl group, 3-hydroxybutyl group and 4-hydroxybutyl group. $X^{a-}$ is an inorganic or organic anion in which a is the valency of said anion. Examples of the inorganic anion include halogen ion, sulfate ion, nitrate ion, carbonate ion, bicarbonate ion, phosphate ion and borate ion. Examples of the organic ion include formate ion, acetate ion, propionate ion, butyrate ion, oxalate ion, malonate ion, maleate ion, fumarate ion, citraconate ion, benzoate ion, toluate ion, phthalate ion, acrylate ion and methyl sulfate ion.

Examples of the quaternary ammonium salt represented by the general formula (I) include tetramethylammonium bicarbonate, tetramethylammonium carbonate, tetramethylammonium formate, tetramethylammonium acetate, tetramethylammonium propionate, tetramethylammonium butyrate, tetramethylammonium oxalate, tetramethylammonium malonate, tetramethylammonium maleate, tetramethylammonium fumarate, tetramethylammonium citraconate, tetramethylammonium benzoate, tetramethylammonium toluate, tetramethylammonium phthalate, tetramethylammonium acrylate, trimethyl(2-hydroxyethyl)ammonium bicarbonate, trimethyl(2-hydroxyethyl)ammonium carbonate, trimethyl(2-hydroxyethyl)ammonium formate, trimethyl(2-hydroxyethyl)ammonium acetate, trimethyl(2-hydroxylethyl)ammonium benzoate, trimethyl(2-hydroxyethyl)ammonium phthalate, tetraethylammonium bicarbonate, tetraethylammonium carbonate, tetraethylammonium formate, tetraethylammonium acetate, tetrapropylammonium formate, tetrapropylammonium acetate, tetrabutylammonium formate, tetrabutylammonium acetate, tetramethylammonium borate, tetramethylammonium phosphate, tetramethylammonium sulfate, trimethyl(2-hydroxyethyl)ammonium borate, trimethyl(2-hydroxyethyl) ammonium phosphate and trimethyl(2-hydroxyethyl) ammonium sulfate.

The quaternary ammonium salt as the component (D) in the cleaning liquid (I) of the invention may be used alone or in combination with at least one other. The content thereof is not specifically limited, but is suitably selected according to the situation, usually in the range of 1 to 50% by weight based on the cleaning liquid. A content thereof less than 1% by weight cause liability to corrosion of the wiring material, whereas a content thereof more than 50% by weight results in a tendency to lower the removal rate of the deposit polymer. Judging from the balance between the corrosion suppression of the wiring material and the removal rate of the deposit polymer, the content thereof is preferably in the range of 3 to 40% by weight.

In the cleaning liquid (II) according to the present invention, there is used, as the component (D'), an organic carboxylic acid ammonium salt and/or an organic carboxylic amine salt represented by the general formula (II)

  (II)

In the general formula (II), Z is hydrogen atom or a mono-to-four valent hydrocarbon group having 1 to 18 carbon atoms, which is exemplified by a saturated or unsaturated aliphatic group and a saturated or unsaturated alicyclic or aromatic group. Examples of the saturated or unsaturated aliphatic group include residual group formed by removing at least one carboxyl group from a carboxylic acid such as acetic acid, propionic acid, butyric acid, valeric acid, heptanoic acid, lauric acid, palmitic acid, stearic acid, acrylic acid, oleic acid, oxalic acid, malonic acid, maleic acid, fumaric acid, citraconic acid, succinic acid, adipic acid, azelaic acid, sebacic acid, decanedicarboxylic acid and butanetetracarboxylic acid. Examples of the saturated or unsaturated alicyclic group include residual group formed by removing at least one carboxyl group from a carboxylic acid such as cyclohexanemonocarboxylic acid; cyclohexane-1, 4-dicarboxyllic acid; cyclohexane-1, 2-dicarboxylic acid; tetrahydrobenzoic acid; tetrahydrophthalic acid; 1,3,5-trimethylcyclohexane-1,3,5-tricarboxylic acid. Examples of such aromatic group include a residual group formed by removing at least one carboxyl group from a carboxylic acid such as benzoic acid, toluic acid, phthalic acid, trimellitic acid, pyromellitic acid, phenylacetic acid and phenylpropionic acid.

On the other hand, $R^3$ is an alkyl group having 1 to 4 carbon atoms or a hydroxyalkyl group having 2 to 4 carbon atoms and may be linear or branched. Such an alkyl group is exemplified by methyl group, ethyl group, n-propyl group, isopropyl group, n-butyl group, isobutyl group, sec-butyl group and tert-butyl group. Examples of such a hydroxyalkyl group include 2-hydroxyethyl group, 2-hydroxypropyl group, 3-hydroxypropyl group, 2-hydroxybutyl group, 3-hydroxybutyl group and 4-hydroxybutyl group, n is an integer from 0 to 3, m is an integer from 1 to 4, and a plurality of $R^3$ may be the same or different.

Examples of the organic carboxylic acid ammonium salt represented by the general formula (II) include ammonium formate, ammonium acetate, ammonium propionate, ammonium butyrate, ammonium valerate, ammonium heptanoate, ammonium laurate, ammonium palmitate, ammonium stearate, ammonium acrylate, ammonium oxalate, ammonium malonate, ammonium maleate, ammonium fumarate, ammonium citraconate, ammonium succinate, ammonium adipate, ammonium azelate, ammonium sebacate, ammonium benzoate, ammonium toluate, ammonium phthalate, ammonium trimellitate and ammonium pyromellitate.

Examples of the organic carboxylic acid amine salt represented by the general formula (II) include monomethylamine formate, dimethylamine formate, triethylamine formate, monomethylamine acetate, dimethylamine acetate, trimethylamine acetate, monoethylamine acetate, diethylamine acetate, triethylamine acetate, monomethylamine benzoate, dimethylamine benzoate, trimethylamine benzoate, monoethylamine benzoate, diethylamine benzoate, triethylamine benzoate, ethanolamine formate, ethanolamine acetate, ethanolamine propionate and ethanolamine benzoate.

The organic carboxylic acid ammonium/amine salt as the component (D') in the cleaning liquid (II) according to the invention may be used alone or in combination with at least one other. The content thereof is not specifically limited, but is suitably selected according to the situation, usually in the range of 1 to 50% by weight. A content thereof less than 1% by weight causes liability to corrosion of the wiring material, whereas a content thereof more than 50% by weight results in a tendency to lower the removal rate of the deposit polymer. Judging from the balance between corrosion suppression of the wiring material and the removal rate of the deposit polymer, the content thereof is preferably in the range of 3 to 40% by weight.

In the cleaning liquid of the present invention, the components (D) and (D') may be used in combination when desired. It is preferable in this case from the aforestated reason, that the total amount of the components (D) and (D') be in the range of 1 to 50%, preferably 3 to 40% by weight.

In the cleaning liquids of the invention, there may be contained as desired, a surfactant as the component (E) for the purpose of enhancing the removal rate of the deposit polymer. Examples of such surfactant include anionic surfactants such as an alkylsulfuric acid ester, polyoxyethylenealkylsulfuric acid ester, alkylarylsulfuric acid ester, alkylbenzensulfonic acid salt, alkylnaphthalenesulfonic acid salt, alkylphosphoric acid salt and polyoxyethylenealkylphosphoric acid salt; cationic surfactants such as alkylamine salt, quaternary ammonium salt and amine oxide; amphoteric surfactants such as alkyl betaine and substituted imidazolinium betaine; nonionic surfactants such as poly (oxyethylene)alkylamine, poly(oxyethylene)-fatty acid ester, glycerol-fatty acid ester, poly(oxyethylene)sorbitol-fatty acid ester, poly(oxyethylene)sorbitan-fatty acid ester, poly(oxyethylene)/poly(oxypropylene) block copolymer, polyoxyethylene derivative, poly(oxyethylene) aryl ether, poly(oxyethylene) alkyl ether, acetylenic alcohol, alkylpoly (oxyethylene) phosphoric acid ester, arylpoly(oxyethylene) phosphoric acid ester, and fatty acid alkanol amide; fluorine compound-based surfactants such as perfluoroalkylsulfonic acid salt, perfluoroalkylcarbonic acid salt, perfluoroalkylquaternary ammonium salt and perfluoroalkylpoly (oxyethylene) ethanol; and siliconic surfactants such as alkylene oxide chain-containing orthosilicic acid alkyl ester and alkylene oxide chain-containing polysilicic acid ester.

The surfactant in the cleaning liquids of the invention may be used alone or in combination with at least one other. The content thereof is not specifically limited, but is suitably selected according to the situation, usually in the range of 0.001 to 1% by weight. A content thereof less than 0.001% by weight causes a fear of failing to sufficiently exhibit the effect on the enhancement for the removal rate of the deposit polymer, whereas a content thereof more than 1% by weight brings about economical disadvantage because of the effect on the enhancement for the removal rate of the deposit polymer being not recognized in proportion to the amount thereof added. Judging from the aspects of the effect on the enhancement for the removal rate of the deposit polymer and economical efficiency, the content thereof is preferably in the range of 0.01 to 0.5% by weight.

The cleaning liquid thus obtained for producing the semiconductor device according to the invention can readily remove the deposit polymer formed in the case of dry etching without corroding metallic films in the production process of semiconductor devices. In particular, it is suitably used for removing protective deposit films stuck to side walls of an insulating layer for via holes and cleaning the bottom of connection holes as well as for removing protective deposit films stuck to side walls of a metallic electroconductive layer in fabricated wiring.

In the following, some description will be given of the process for producing a semiconductor device according to the present invention.

The process of the present invention includes two modes. The first mode comprises the steps of forming a prescribed resist pattern on a semiconductor substrate equipped on the surface thereof with an insulating film layer; forming a via hole by dry etching using said resist pattern as a mask; then removing said resist pattern by effecting an ashing treatment by means of oxygen plasma or a wet treatment by resist-stripper; and thereafter effecting a cleaning treatment by the use of the aforestated cleaning liquid. The second mode comprises the steps of forming a prescribed resist pattern on a semiconductor substrate equipped on the surface thereof with a metallic electroconductive film layer; forming metallic wiring by dry etching using said resist pattern as a mask; then removing said resist pattern by effecting an ashing treatment by means of oxygen plasma or a wet treatment by resist-stripper; and thereafter effecting a cleaning treatment by the use of the aforestated cleaning liquid.

At least one insulating film layer, metallic electroconductive film layer, reflection preventive film layer and the like may be placed at need, between the abovementioned insulating film layer or metallic electroconductive film layer and the substrate. In addition, a reflection preventive film layer may be placed at need, on the upper metallic electroconductive film layer.

As the substrate to be used in the process of the invention, there is preferably used a substrate which has heretofore been customarily used in the production of semiconductor devices, for example, silicon wafer. The insulating film is not specifically limited, but is exemplified by that which has heretofore been customarily used in the production of semiconductor devices, e.g. silicon oxide film, silicon nitride film and aluminium oxide film. Of these silicon oxide film is preferable. The silicon oxide film, when formed directly on a silicon wafer, can be formed by heating the silicon wafer at a high temperature in an atmosphere of oxygen gas. The silicon oxide film may be formed by chemical vapor deposition (CVD) method, and in this case, may be mixed in with a small amount of impurities for the purpose of diffusion. The silicon oxide film which is formed by CVD method is sometimes called CVD silicon oxide film, and CVD silicon oxide film which has been mixed in with a small amount of impurites for diffusion is sometimes called doped CVD oxide film, whereas CVD silicon oxide film which is not mixed in therewith is sometimes called non-doped CVD silicon oxide film.

On the other hand, the metallic electroconductive film layer is not specifically limited, but is selected for use from those which have heretofore been customarily used in the production of semiconductor devices, e.g. a film comprising tungsten, a tungsten alloy, titanium, a titanium alloy, a titanium/tungsten alloy, titanium nitride, aluminum or the like. The aforesaid metallic electroconductive film layer can be formed by vacuum deposition method, sputtering method, CVD method or the like. As the reflection preventive film layer there is used, e.g. titanium nitride film. The metallic electroconductive films that are formed by a sputtering method and CVD method are sometimes called e.g. sputter tungsten film, CVD tungsten film, respectively.

In the case of carrying out the process of the invention, a prescribed resist pattern is first formed on the insulating film layer or the metallic electroconductive layer. There are available various methods for forming resist pattern, from which a suitable method is selected according to the situation, for example, a method comprising the steps of coating the layer with a solution of a negative type or positive type photoresist by means of a spinner and drying the same to form a resist layer thereon; then irradiating the layer with an active ray such as ultraviolet ray or far ultraviolet rays via a prescribed mask with a reduction projection exposure unit, etc. or irradiating with an excimer laser beam or X-ray via a mask, or irradiating while scanning an electron beam; and thereafter performing a developing treatment by using a proper developing solution.

Subsequently, using the resist pattern thus formed as a mask, dry etching is carried out. A variety of dry etching methods are available, of which mention is made of plasma etching method as a typical method. In the plasma etching, there is usually used fluorine or a fluorine compound gas such as tetrafluoromethane as an etching gas, however, the type of the etching gas and etching conditions are suitably selected according to the object of etching. By this dry etching treatment, a via hole is formed in the aforesaid first mode, and metallic wiring is formed in the second mode.

In the dry etching treatment, a deposit polymer attributable to etching gases, resist and processed film is formed and stuck to the inside or periphery of the via hole, or the side walls of metallic electroconductive film layer after wiring is formed on said layer.

In the subsequent step of removing the resist pattern, an ashing method with oxygen plasma or a wet treatment by a resist-stripper is applied to the process of the invention, which is economically advantageous, since both dry etching and ashing treatments can be put into practice with the same apparatus only by altering the type of the gas, when plasma etching is applied to the dry etching. Moreover, fluorine or a fluorine compound gas in a volume of 5 to 20%, when added to oxygen gas in the ashing treatment with oxygen plasma, remarkably facilitates the removal of the deposit polymer in the subsequent cleaning treatment step. The fluorine compound gas is exemplified by $CF_4$, $CHF_3$, $SF_6$, $NF_3$ and $C_2F_6$. The ashing treatment temperature is 15 to 80° C. for a long time treatment of 2 to 5 minutes, but is 150 to 180° C. for a short time treatment of 2 to 5 seconds due to operational reason. An unreasonably low temperature causes a fear of insufficient proceeding of the ashing treatment, whereas an unreasonably high temperature sometimes brings about corrosion of metallic wiring such as tungsten wiring.

Subsequently, the device thus ashing-treated with oxygen plasma or a wet treatment by a resist-stripper is subjected to cleaning treatment by the use of the cleaning liquid according to the present invention to remove the deposit polymer formed in the case of dry etching treatment. The cleaning temperature and cleaning period of time are each suitably selected according to the state of deposit polymer, kind of the wiring material and the like. The cleaning temperature is usually 10 to 30° C. to be sufficient, but may be raised to about 60° C. in the case of an excessively low removal rate of the deposit polymer. The cleaning period of time is usually about 1 to 30 minutes. The cleaning system may be adopted from batch-wise immersion cleaning, spray cleaning by sheet-fed system and atomizing cleaning.

By the above-described cleaning treatment it is has been made possible to readily remove a deposit polymer formed and stuck to the inside and periphery of a via hole which polymer has heretofore been difficult to remove, and further to remove a deposit polymer formed and stuck to side walls, etc. after wiring of a metallic electroconductive film layer without causing corrosion of the metallic electroconductive film layer.

After the cleaning treatment, pure water cleaning is carried out by the above system, followed by drying treatment.

In the case of the first mode, the prescribed semiconductor device is obtained by connecting, through the via hole thus cleaned, the metallic electroconductive film layer formed for wiring, on a lower layer of an insulating film to the metallic electroconductive film layer formed on the upper layer of said insulating film. In the case of the second mode, the prescribed semiconductor device is obtained by, after said cleaning for wiring of the metallic electroconductive film, forming interlaminar insulating films and completing metallic wiring.

According to the cleaning liquid for producing a semiconductor device of the invention, it is made possible to readily remove a deposit polymer which is formed in the case of dry etching in a semiconductor-device production process, especially a deposit polymer formed and stuck to the inside and periphery of a via hole, and a deposit polymer formed and stuck to side walls, etc. after wiring of a metallic electroconductive film layer without causing corrosion of the metallic film.

According to the process for producing a semiconductor device of the invention, since a deposit polymer is certainly removed in the via hole forming step, the vicinity of a via hole, which via hole is formed particularly in the insulating layer including a SOG layer, is freed from pollution and thus is cleaned, thus enabling sufficient connection of metallic wiring and the formation of a high quality and highly reliable semiconductor device. In the metallic wiring formation step, a deposit polymer on the side walls of electroconductive films which polymer has heretofore been difficult to remove, can readily be removed, thus assuring corrosion-free and clean wiring and the formation of a high quality and highly reliable semiconductor device.

In the following, the present invention will be described in more detail with reference to working examples, which however shall never limit the present invention thereto.

EXAMPLE 1

FIG. 1 is a schematic drawing showing the process for producing a semiconductor device in this example.

(1) Formation of Via Hole

As shown in FIG. 1(a), on a surface-oxidized silicon wafer were successively formed an Al—Si—Cu alloy layer 1 in 0.5 m thickness; a TiN layer 2 in 500 Å thickness as a reflection preventive layer; and an insulating film layer 3 comprising a CVD silicon oxide film in 0.8 m thickness which comprises doped CVD silicon oxide film and non-doped CVD silicon oxide film.

(2) Formation of Resist Pattern

Figure 1B:
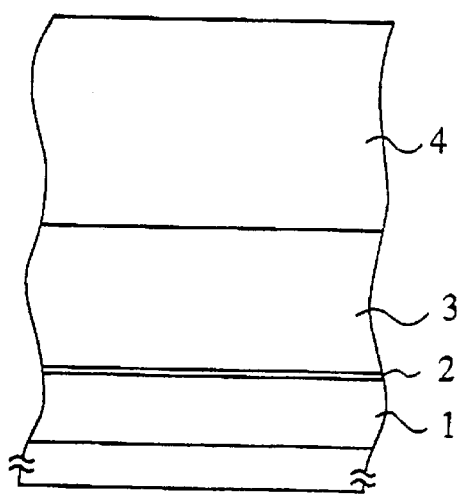
Figure 1C:
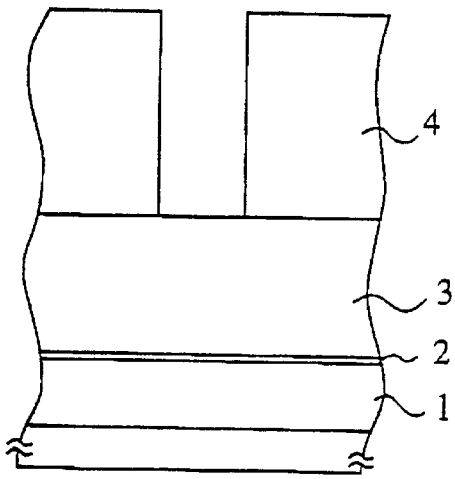

On the insulating film layer 3 comprising a CVD silicon oxide film in (1) was placed a positive resist layer 4 in 1.0 m thickness as shown in FIG. 1(b). Then, the layers were selectively irradiated for exposure with i-rays via a prescribed mask by means of projection method, heat treated at 110° C. for 90 sec., subjected to developing treatment with 2.38% aqueous solution of tetramethylammonium hydroxide (TMAH), washed with water and dried to form a resist pattern with an opening as shown in FIG. 1(c).

(3) Dry Etching Treatment

Figure 1D:
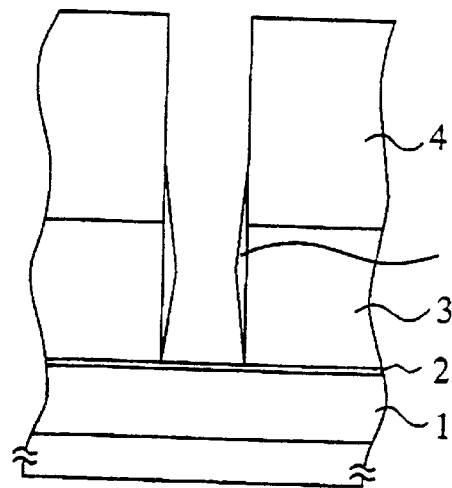

By using the resist pattern obtained in (2) as a mask, the insulating film layer was subjected to dry etching treatment under the following conditions to form a via hole as shown in FIG. 1(d).

Dry Etching Conditions:

Parallel flat plate type RIE, treatment pressure of 750 m Torr, RF electric power of 300 W, mixed gas of $CHF_3$, $CF_4$ and Ar, treatment time of 152 sec.

(4) Ashing Treatment with Oxygen Plasma

Figure 1E:
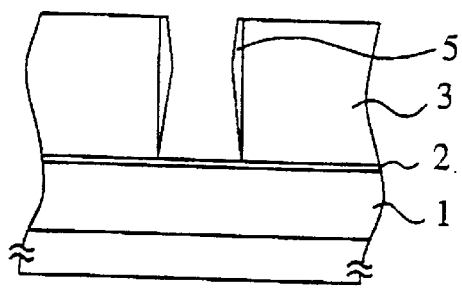

The resist pattern after dry etching treatment in (3) was removed by ashing treatment at 170° C. for 180 sec. by the use of oxygen. As can be seen from FIG. 1(e) showing the state after ashing treatment, there was recognized a deposit polymer 5 stuck to the side wall of the CVD silicon oxide film.

(5) Cleaning Treatment

The device subjected to ashing treatment with oxygen plasma in (4) was subjected to cleaning treatment at 23° C. for 3 min. by using a cleaning liquid consisting of 8% by weight of ammonium fluoride, 1% by weight of propionic acid, 5% by weight of tetramethylammonium formate, 40% by weight of dimethylformamide (DFM), 0.1% by weight of a nonionic surfactant EP-120 A [poly(oxyethylene)phenyl ester, produced by Dai-ichi Kogyo Seiyaku Co., Ltd.] and 45.9% by weight of water, followed by washing with water and drying. The state is shown in FIG. 1(f).

Figure 1F:
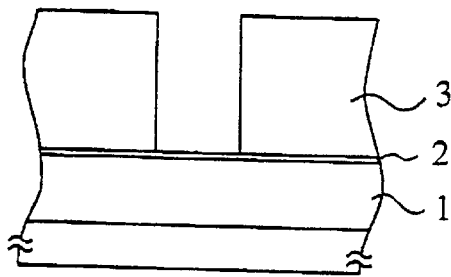

It can be seen from FIG. 1(f), that the deposit polymer stuck to the side wall of the CVD silicon oxide film was completely removed and the side wall was cleaned.

(6) Bonding of Metallic Film

Finally, an Al—Si—Cu layer of sublayer metallic film was bonded to an Al—Si—Cu layer of upper layer metallic film via the cleaned via hole in (5) to fabricate a semiconductor device.

EXAMPLES 2 TO 4, REFERENCE EXAMPLE AND COMPARATIVE EXAMPLE

The device subjected to ashing treatment with oxygen plasma in Example 1-(4) was subjected to cleaning treatment by using the cleaning liquid whose chemical composition is given in Table 1. under the condition as given also in Table 1. followed by washing with water and drying. Then evaluation was made of the removability of the deposit polymer and corrosion suppression in accordance with the following criterion. The results are given in Table 1.

⊚: deposit polymer completely removed, or corrosion completely suppressed

Δ: residual deposit polymer slightly observed, or corrosion suppression slightly observed X: residual deposit polymer observed, or corrosion suppression unobserved

TABLE 1

| | Cleaning liquid composition | | | | | |
|---|---|---|---|---|---|---|
| | ammonium fluoride | organic carboxylic acid | | organic Solvent | | |
| | (wt %) | kind | (wt %) | kind | (wt %) | |
| Example 1 | 8 | propionic acid | 1 | dimethylformamide | 40 | |
| Example 2 | 8 | phthalic anhydride | 0.1 | formamide | 40 | |
| Example 3 | 5 | isobutyric acid | 0.2 | dimethylacetamide | 35 | |
| Example 4 | 10 | acetic acid | 0.1 | dimethylformamide | 45 | |
| Example 5 | 1 | boric acid | 0.3 | dimethylformamide | 69 | |
| Reference Example | 8 | propionic acid | 0.2 | dimethylformamide | 40 | |
| Comparative Example 1 | 8 | — | — | dimethylformamide | 40 | |

TABLE 1-continued

| | | | | | | | |
|---|---|---|---|---|---|---|---|
| Comparative Example 2 | 1 | — | — | — | dimethyl-formamide | 69 | |

| | Cleaning liquid composition | | | | Cleaning conditions | Removability of deposit polymer | Corrosion suppression of material |
|---|---|---|---|---|---|---|---|
| | Salt | | Surfactant | | | | |
| | kind | (wt %) | kind | (wt %) | | | |
| Example 1 | TMAF [1] | 5 | EP-120A [3] | 0.1 | 23° C. 3 minutes | ⊚ | ⊚ |
| Example 2 | TMAF | 5 | EP-120A | 0.1 | 23° C. 3 minutes | ⊚ | ⊚ |
| Example 3 | TMAF | 10 | EP-120A | 0.1 | 23° C. 3 minutes | ⊚ | ⊚ |
| Example 4 | TMBC [2] | 3 | EP-120A | 0.1 | 23° C. 3 minutes | ⊚ | ⊚ |
| Example 5 | — | — | — | — | 23° C. 10 minutes | ⊚ | ⊚ |
| Reference Example | TMAF | 5 | — | — | 23° C. 10 minutes | Δ | Δ |
| Comparative Example 1 | TMAF | 5 | EP-120A | 0.1 | 23° C. 10 minutes | X | Δ |
| Comparative Example 2 | — | — | — | — | 23° C. 10 minutes | ⊚ | X |

Remarks
[1] TMAF: tetramethylammonium formate
[2] TMBC: tetramethylammonium acetate
[3] EP-120A: nonionic surfactant, polyoxyethylene phenyl ether, produced by Dai-ichi kogyo Seiyaku co., Ltd.

EXAMPLE 5

The procedure in Example 1 was repeated except that tungsten layer and TiN layer were used in place of Al—Si—Cu layer. The results were the same as those in Example 1.

EXAMPLE 6

The procedures in Examples 1 to 4 were each repeated except that ashing treatment with oxygen plasma was carried out by ashing treatment with oxygen plasma at 170° C. for 180 sec. as the first step, followed by ashing treatment with plasma with the mixed gas of 10% by volume of $CF_4$ and the balance oxygen at 170° C. for 2.5 sec. As is the case with Example 1, the deposit polymer was completely removed in the cleaning step, and the place to which the polymer had been stuck was cleaned.

EXAMPLE 7

FIG. 2 is a schematic drawing showing the process for producing a semiconductor device in this example.
(1) Formation of Metallic Electroconductive Film Layer As shown on FIG. 2(a), on a CVD silicon oxide film 11 on the upper side of a silicon wafer were successively formed a TiN layer 12 in 500 Å thickness, a sputter tungsten layer 13 in 1500 Å thickness, a CVD tungsten layer 14 in 1500 Å thickness, and TiN layer 15 in 500 Å thickness as a reflection preventive layer.
(2) Formation of Resist Pattern On the TiN layer 15 in the above (1) was placed a positive resist layer 16 in 1.0 m thickness as shown in FIG. 2(b). Then, the layers were selectively irradiated for exposure with i-rays via a prescribed mask by means of a projection method, heat treated at 110° C. for 90 sec., subjected to developing treatment with 2.38% aqueous solution of tetramethylammonium hydroxide (TMAH), washed with water and dried to form a resist pattern as shown in FIG. 2(c).

(3) Dry Etching Treatment

Figure 2A:
FIG. 2 is a schematic drawing showing the process for producing a semiconductor device in Example 7.
Figure 2B:
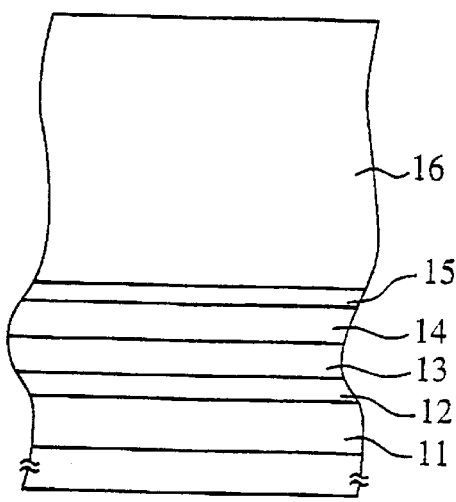
Figure 2C:
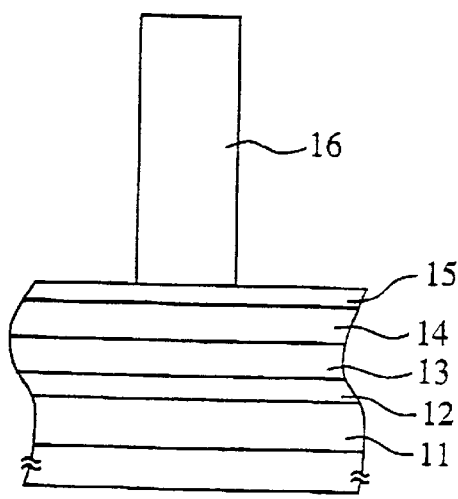
Figure 2D:
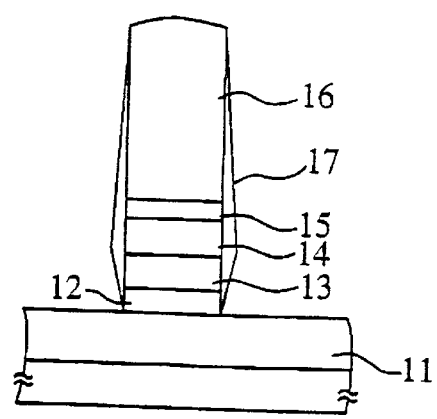

By using a resist pattern obtained in (2) as a mask, the electroconductive layer was subjected to dry etching treatment under the following conditions to form metallic wiring as shown in FIG. 2(d).

Dry etching conditions:

ECR (Electron Cynchrotron Resonance)
① Treatment pressure; 10 m Torr, $\mu$ wave incidence current; 300 mA, RF electric power; 25 W; $Cl_2$; treatment time; 10 sec.
② Treatment pressure; 10 m Torr, $\mu$ wave incidence current; 350 mA, RF electric power; 20 W, mixed gas; ($Cl_2/SF_6$), treatment time; 25 sec.
③ Treatment pressure; 10 m Torr, $\mu$ wave incidence current; 350 mA, FR electric power 50 W, $Cl_2$, treatment time; 25 sec.

(4) Ashing Treatment with Oxygen Plasma

Figure 2E:
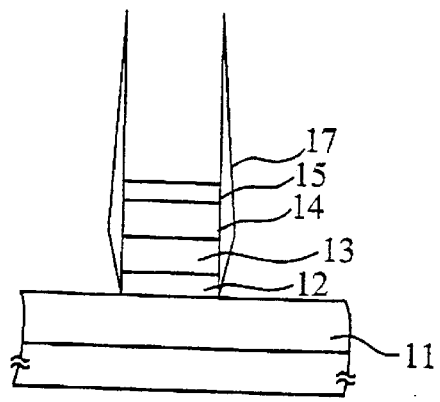

The resist pattern after dry etching treatment in (3) was removed by an ashing treatment at 170° C. for 180 sec. by the use of oxygen. As can be seen from FIG. 2(e) showing the state after an ashing treatment, there was recognized a deposit polymer an insulating film and stuck to the side wall of the CVD silicon oxide film.

(5) Cleaning Treatment

The device subjected to ashing treatment with oxygen plasma in the above (4) was subjected to cleaning treatment in the same manner as in Example 1-(5), followed by washing with water and drying. The state is shown in FIG. 2(f).

Figure 2F:
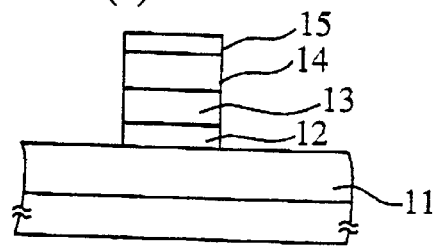

It can be seen from FIG. 2(f) that the deposit polymer 17 stuck to the side wall of the electroconductive film was completely removed and the side wall was cleaned.

(6) Formation of Interlaminar Insulating Film

Finally, a interlaminar insulating film was formed and metallic wiring was completed to fabricate the objective semiconductor device.

EXAMPLE 8

The procedure in Examples 7-(4) was repeated except that ashing treatment with oxygen plasma was carried out by ashing treatment with oxygen plasma at 170° C. for 180 sec. as the first step, followed by ashing treatment with plasma with the mixed gas of 10% by volume of CF$_4$ and the balance oxygen at 170° C. for 2.5 sec. As is the case with Example 1, the deposit polymer was completely removed in the cleaning step, and the place to which the polymer had been stuck was cleaned.

EXAMPLE 9

FIG. 3 is a schematic drawing showing the process for producing a semiconductor device in this example.

(1) Formation of Metallic Electroconductive Film Layer

Figure 3A:
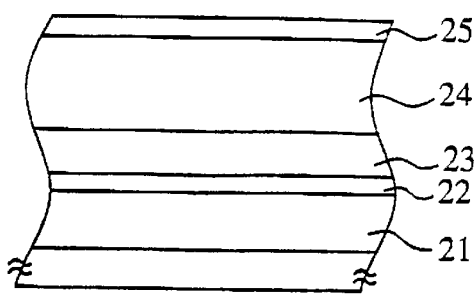
FIG. 3 is a schematic drawing showing the process for producing a semiconductor device in Example 9.

As shown on FIG. 3(a), on a CVD silicon oxide film 21 on the upper side of a silicon wafer were successively formed a sputter tungsten layer 22 in 500 Å thickness, a CVD tungsten layer 23 in 1000 Å thickness, an Al—Si—Cu alloy layer 24 in 5000 Å thickness, and a TiN layer 25 in 500 Å thickness as a reflection preventive layer.

(2) Formation of Resist Pattern

Figure 3B:
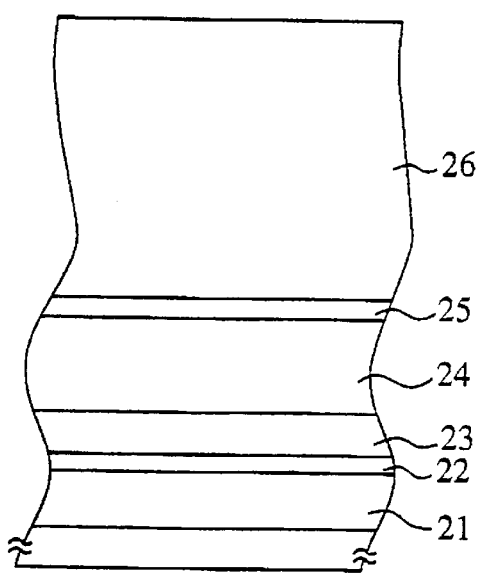
Figure 3C:
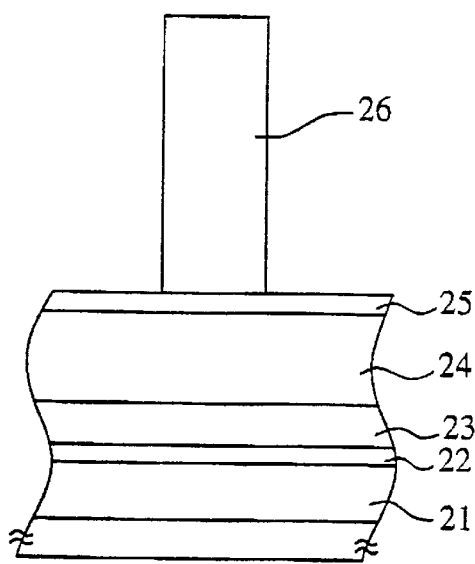

On the TiN layer 25 in the above (1) was placed a positive resist layer 26 in 1.6 μm thickness as shown in FIG. 3(b). Then, the layers were selectively irradiated for exposure with i-rays via a prescribed mask by means of a projection method, heat treated at 110° C. for 90 sec., subjected to developing treatment with 2.38% aqueous solution of tetramethylammonium hydroxide (TMAH), washed with water and dried to form a resist pattern as shown in FIG. 3(c).

(3) Dry Etching Treatment

Figure 3D:
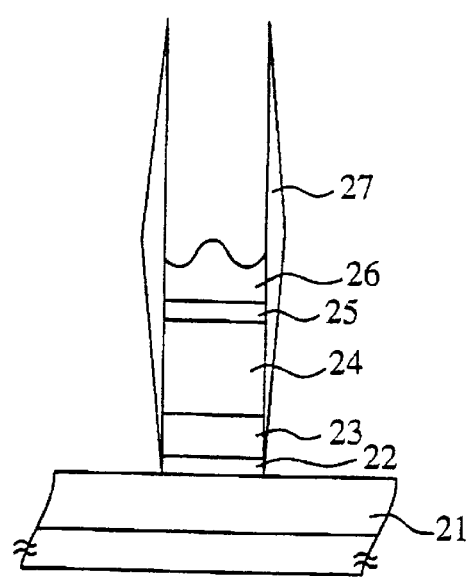

By using the resist pattern obtained in (2) as a mask, the electroconductive layer was subjected to dry etching treatment under the following conditions to form metallic wiring as shown in FIG. 3(d).

Dry etching conditions:

ECR (Electron Cynchrotron Resonance)

① Treatment pressure; 8 m Torr, μ wave incidence current; 250 mA, RF electric power; 20 W, mixed gas; (BCl$_3$/SF$_6$), treatment time; 9 sec.

② Treatment pressure; 8 m Torr, μ wave incidence current; 320 mA, RF electric power; 60 W, mixed gas; (BCl$_3$/Cl$_2$), treatment time; 30 sec.

③ Treatment pressure; 8 m Torr, μ wave incidence current; 250 mA, FR electric power; 20 W, mixed gas; (BCl$_3$/SF$_6$), treatment time; 25 sec.

(4) Ashing Treatment with Oxygen Plasma

Figure 3E:
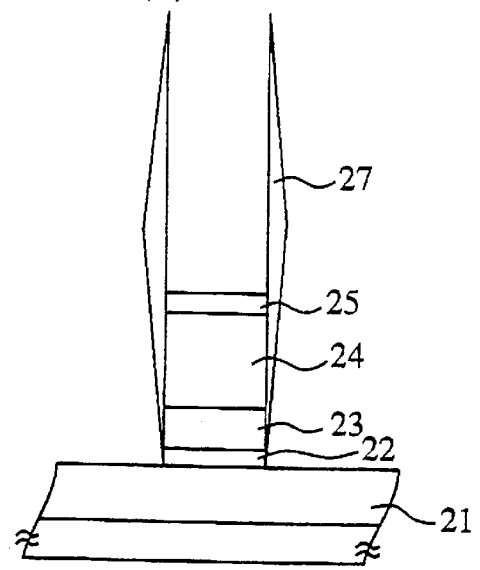

The resist pattern after dry etching treatment in (3) was removed by ashing treatment at 170° C. for 180 sec. by the use of oxygen. As can be seen from FIG. 3(e) showing the state after ashing treatment, there was recognized a deposit polymer 27 stuck to the side wall of the metallic electroconductive film.

(5) Cleaning Treatment

The device subjected to ashing treatment with oxygen plasma in the above (4) was subjected to cleaning treatment in the same manner as in Example 1-(5), followed by washing with water and drying. The state is shown in FIG. 3(f).

Figure 3F:
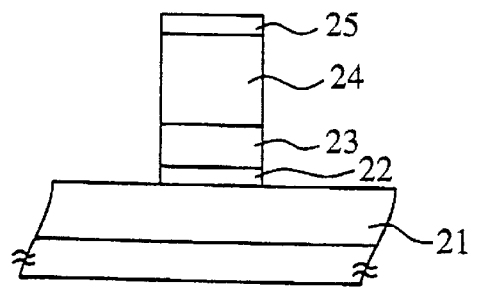

It can be seen from FIG. 3(f) that the deposit polymer 27 stuck to the side wall of the electroconductive film was completely removed and the side wall was cleaned.

(6) Formation of Interlaminar Insulating Film

Finally, a interlaminar insulating film was formed and metallic wiring was completed to fabricate the objective semiconductor device.

EXAMPLE 10

The procedure in Examples 9-(4) was repeated except that ashing treatment with oxygen plasma was carried out by ashing treatment with oxygen plasma at 170° C. for 180 sec. as the first step, followed by ashing treatment with plasma with the mixed gas of 10% by volume of CF$_4$ and the balance oxygen at 170° C. for 2.5 sec. As is the case with Example 1, the deposit polymer was completely removed in the cleaning step, and the place to which the polymer had been stuck was cleaned.

What is claimed is:

1. A cleaning liquid in the form of an aqueous solution for cleaning a semiconductor device during production of a semiconductor device, which comprises (A) a fluorine-containing compound;

(B) a water-soluble or water-miscible organic solvent;

(C) an organic acid; and (D) a quaternary ammonium salt represented by the formula (I):

$$((R^1)_3N\text{-}R^2)^+{}_a X^{a-} \quad (I)$$

wherein $R^1$ is an alkyl group having 1 to 4 carbon atoms in which three $R^1$ are the same or different, $R^2$ is an alkyl group having 1 to 4 carbon atoms or a hydroxyalkyl group having 1 to 4 carbon atoms, and $X^{a-}$ is an inorganic or organic anion in which a is the valency of said anion.

2. The cleaning liquid according to claim 1, which further comprises (E) a surfactant.

3. The cleaning liquid according to claim 1, wherein said organic acid is selected from the group consisting of formic acid, acetic acid, propionic acid, butyric acid, isobutyric acid, valeric acid, isovaleric acid, heptanoic acid, lauric acid, palmitic acid, stearic acid, acrylic acid, crotonic acid, methacrylic acid, oxalic acid, malonic acid, maleic acid, succinic acid, adipic acid, azelaic acid, sebacic acid, benzoic acid, toluic acid, phthalic acid, trimellitic acid, pyromellitic acid, benzenesulfonic acid, toluenesulfonic acid, salicylic acid and phthalic anhydride.

4. The cleaning liquid according to claim 2, wherein said organic acid is selected from the group consisting of formic acid, acetic acid, propionic acid, butyric acid, isobutyric acid, valeric acid, isovaleric acid, heptanoic acid, lauric acid, palmitic acid, stearic acid, acrylic acid, crotonic acid, methacrylic acid, oxalic acid, malonic acid, maleic acid, succinic acid, adipic acid, azelaic acid, sebacic acid, benzoic acid, toluic acid, phthalic acid, trimellitic acid, pyromellitic acid, benzenesulfonic acid, toluenesulfonic acid, salicylic acid and phthalic anhydride.

5. A cleaning liquid in the form of an aqueous solution for cleaning a semiconductor device during production of a semiconductor device, which comprises (A) a fluorine-containing compound;

(B) a water-soluble or water-miscible organic solvent;

(C) an inorganic acid selected from the group consisting of boric acid, phosphoric acid, phosphorous acid, hypophosphorous acid, polyphosphoric acid, sulfuric acid, chloric acid, chlorous acid, hypochlorous acid, bromic acid, bromous acid, hypobromous acid, iodic acid, iodous acid, hypoiodous acid, nitric acid and nitrous acid; and (D) a quaternary ammonium salt represented by the formula (I):

$$((R^1)_3N\text{-}R^2)^+{}_a X^{a-} \quad (I)$$

wherein $R^1$ is an alkyl group having 1 to 4 carbon atoms in which three $R^1$ are the same or different, $R^2$ is an alkyl group having 1 to 4 carbon atoms or a hydroxyalkyl group having 1 to 4 carbon atoms, and $X^{a-}$ is an inorganic or organic anion in which a is the valency of said anion.

6. The cleaning liquid according to claim 5, which further comprises (E) a surfactant.

7. The cleaning liquid according to claim 5, wherein said inorganic acid is boric acid or phosphoric acid.

8. The cleaning liquid according to claim 6, wherein said inorganic acid is boric acid or phosphoric acid.

9. A cleaning liquid in the form of an aqueous solution for cleaning a semiconductor device during production of a semiconductor device, which comprises (A) a fluorine-containing compound;

(B) a water-soluble or water-miscible organic solvent;

(C) an organic acid;

(D) at least one salt selected from the group consisting of an organic carboxylic acid ammonium salt and an organic carboxylic acid amine salt, said salt being represented by the formula (II):

Z-(COONH$_{4-n}$(R$^3$)$_n$)$_m$     (II)

wherein Z is a hydrogen atom or a mono-valent to tetravalent hydrocarbon group having 1 to 18 carbon atoms, R$^3$ is an alkyl group having 1 to 4 carbon atoms or a hydroxyalkyl group having 2 to 4 carbon atoms, n is an integer from 0 to 3, m is an integer from 1 to 4 and a plurality of R$^3$, when present, are the same or different; and (E) a surfactant.

10. The cleaning liquid according to claim 9, wherein said organic acid is selected from the group consisting of formic acid, acetic acid, propionic acid, butyric acid, isobutyric acid, valeric acid, isovaleric acid, heptanoic acid, lauric acid, palmitic acid, stearic acid, acrylic acid, crotonic acid, methacrylic acid, oxalic acid, malonic acid, maleic acid, succinic acid, adipic acid, azelaic acid, sebacic acid, benzoic acid, toluic acid, phthalic acid, trimellitic acid, pyromellitic acid, benzenesulfonic acid, toluenesulfonic acid, salicylic acid and phthalic anhydride.

11. A cleaning liquid in the form of an aqueous solution for cleaning a semiconductor device during production of a semiconductor device, which comprises (A) a fluorine-containing compound;

(B) a water-soluble or water-miscible organic solvent;

(C) an inorganic acid selected from the group consisting of boric acid, phosphoric acid, phosphorous acid, hypophosphorous acid, polyphosphoric acid, sulfuric acid, chloric acid, chlorous acid, hypochlorous acid, bromic acid, bromous acid, hypobromous acid, iodic acid, iodous acid, hypoiodous acid, nitric acid and nitrous acid;

(D) at least one salt selected from the group consisting of an organic carboxylic acid ammonium salt and an organic carboxylic acid amine salt, said salt being represented by the formula (II):

Z-(COONH$_{4-n}$(R$^3$)$_n$)$_m$     (II)

wherein Z is a hydrogen atom or a mono-valent to tetravalent hydrocarbon group having 1 to 18 carbon atoms, R$^3$ is an alkyl group having 1 to 4 carbon atoms or a hydroxyalkyl group having 2 to 4 carbon atoms, n is an integer from 0 to 3, m is an integer from 1 to 4 and a plurality of R$^3$, when present, are the same or different; and (E) a surfactant.

12. The cleaning liquid according to claim 11, wherein said inorganic acid is boric acid.

13. The cleaning liquid according to claim 11, wherein said inorganic acid is boric acid.

14. The cleaning liquid according to claim 3, wherein the fluorine-containing compound is at least one compound selected from the group consisting of hydrofluoric acid, ammonium fluoride, ammonium hydrogen fluoride and ammonium borofluoride; the fluorine-containing compound being in an amount of 0.1 to 15% by weight; the organic solvent is at least one compound selected from the group consisting of formamide, N-methylformamide, N,N-dimethylformamide, N,N-dimethylacetamide, N-methylpyrrolidone, r-butyrolactone, methanol, ethanol, isopropanol, ethylene glycol, methyl acetate, ethyl acetate, butyl acetate, methyl lactate, ethyl lactate, ethylene glycol monobutyl ether, diethylene glycol monomethyl ether, diethylene glycol monoethyl ether, dimethyl sulfoxide and sulfolane; the organic solvent is in an amount of 1 to 80% by weight; the acid is in an amount of 0.01 to 5% by weight; the quaternary ammonium salt is at least one compound selected from the group consisting of tetramethylammonium bicarbonate, tetramethylammonium carbonate, tetramethylammonium formate, tetramethylammonium acetate, tetramethylammonium propionate, tetramethylammonium butyrate, tetramethylammonium oxalate, tetramethylammonium malonate, tetramethylammonium maleate, tetramethylammonium fumarate, tetramethylammonium citraconate, tetramethylammonium benzoate, tetramethylammonium toluate, tetramethylammonium phthalate, tetramethylammonium acrylate, trimethyl(2-hydroxyethyl)ammonium bicarbonate, trimethyl(2-hydroxyethyl)ammonium carbonate, trimethyl(2-hydroxyethyl)ammonium formate, trimethyl(2-hydroxyethyl)ammonium acetate, trimethyl(2-hydroxylethyl)ammonium benzoate, trimethyl(2-hydroxyethyl)ammonium phthalate, tetraethylammonium bicarbonate, tetraethylammonium carbonate, tetraethylammonium formate, tetraethylammonium acetate, tetrapropylammonium formate, tetrapropylammonium acetate, tetrabutylammonium formate, tetrabutylammonium acetate, tetramethylammonium borate, tetramethylammonium phosphate, tetramethylammonium sulfate, trimethyl(2-hydroxyethyl)ammonium borate, trimethyl(2-hydroxyethyl) ammonium phosphate and trimethyl(2-hydroxyethyl) ammonium sulfate;

the quaternary ammonium salt is in an amount of 1 to 50% by weight.

15. The cleaning liquid according to claim 5, wherein the fluorine-containing compound is at least one compound selected from the group consisting of ammonium fluoride, ammonium hydrogen fluoride and ammonium borofluoride; the fluorine-containing compound is in an amount of 0.1 to 15% by weight; the organic solvent is at least one compound selected from the group consisting of formamide, N-methylformamide, N,N-dimethylformamide, N,N-dimethylacetamide, N-methylpyrrolidone, r-butyrolactone, methanol, ethanol, isopropanol, ethylene glycol, methyl acetate, ethyl acetate, butyl acetate, methyl lactate, ethyl lactate, ethylene glycohol monobutyl ether, diethylene glycol monomethyl ether, diethylene glycol monoethyl ether, dimethyl sulfoxide and sulfolane; the organic solvent is in an amount of 1 to 80% by weight; the acid is in an amount of 0.01 to 5% by weight; the quaternary ammonium salt is at least one compound selected from the group consisting of tetramethylammonium bicarbonate, tetramethylammonium carbonate, tetramethylammonium formate, tetramethylammonium acetate, tetramethylammonium propionate, tetramethylammonium butyrate, tetramethylammonium oxalate, tetramethylammonium malonate, tetramethylammonium maleate, tetramethylammonium fumarate, tetramethylammonium citraconate, tetramethylammonium benzoate, tetramethylammonium toluate, tetramethylammonium phthalate, tetramethylammonium acrylate, trimethyl(2-hydroxyethyl)ammonium bicarbonate, trimethyl(2-hydroxyethyl)ammonium carbonate, trimethyl(2-hydroxyethyl)ammonium formate, trimethyl(2-hydroxyethyl)ammonium acetate, trimethyl(2-hydroxylethyl)ammonium benzoate, trimethyl(2-hydroxyethyl)ammonium phthalate, tetraethylammonium bicarbonate, tetraethylammonium carbonate, tetraethylammonium formate, tetraethylammonium acetate, tetrapropylammonium formate, tetrapropylammonium acetate, tetrabutylammonium formate, tetrabutylammonium acetate, tetramethylammonium borate, tetramethylammonium phosphate, tetramethylammonium sulfate, trimethyl(2-hydroxyethyl)ammonium borate, trimethyl(2-hydroxyethyl) ammonium phosphate and trimethyl(2-hydroxyethyl) ammonium sulfate;

the quaternary ammonium salt is in an amount of 1 to 50% by weight.

16. The cleaning liquid according to claim 9, wherein the fluorine-containing compound is at least one compound selected from the group consisting of hydrofluoric acid, ammonium fluoride, ammonium hydrogen fluoride and ammonium borofluoride; the fluorine-containing compound is in an amount of 0.1 to 15% by weight; the organic solvent is at least one compound selected from the group consisting of formamide, N-methylformamide, N,N-dimethylformamide, N,N-dimethylacetamide, N-methylpyrrolidone, r-butyrolactone, methanol, ethanol, isopropanol, ethylene glycol, methyl acetate, ethyl acetate, butyl acetate, methyl lactate, ethyl lactate, ethylene glycol monobutyl ether, diethylene glycol monomethyl ether, diethylene glycol monoethyl ether, dimethyl sulfoxide and sulfolane; the organic solvent is in an amount of 1 to 80% by weight; the acid is in an amount of 0.01 to 5% by weight; said salt being at least one compound selected from the group consisting of ammonium formate, ammonium acetate, ammonium propionate, ammonium butyrate, ammonium valerate, ammonium heptanoate, ammonium laurate, ammonium palmitate, ammonium stearate, ammonium acrylate, ammonium oxalate, ammonium malonate, ammonium maleate, ammonium fumarate, ammonium citraconate, ammonium succinate, ammonium adipate, ammonium azelate, ammonium sebacate, ammonium benzoate, ammonium toluate, ammonium phthalate, ammonium trimellitate, ammonium pyromellitate, monomethylamine formate, dimethylamine formate, triethylamine formate, monomethylamine acetate, dimethylamine acetate, trimethylamine acetate, monoethylamine acetate, diethylamine acetate, triethylamine acetate, monomethylamine benzoate, dimethylamine benzoate, trimethylamine benzoate, monoethylamine benzoate, diethylamine benzoate, triethylamine benzbate, ethanolamine formate, ethanolamine acetate, ethanolamine propionate and ethanolamine benzoate;
said salt is in an amount of 1 to 50% by weight.

17. The cleaning liquid according to claim 11, wherein the fluorine-containing compound is at least one compound selected from the group consisting of ammonium fluoride, ammonium hydrogen fluoride and ammonium borofluoride; the fluorine-containing compound is in an amount of 0.1 to 15% by weight; the organic solvent is at least one compound selected from the group consisting of formamide, N-methylformamide, N,N-dimethylformamide, N,N-dimethylacetamide, N-methylpyrrolidone, r-butyrolactone, methanol, ethanol, isopropanol, ethylene glycol, methyl acetate, ethyl acetate, butyl acetate, methyl lactate, ethyl lactate, ethylene glycol monobutyl ether, diethylene glycol monomethyl ether, diethylene glycol monoethyl ether, dimethyl sulfoxide and sulfolane; the organic solvent is in an amount of 1 to 80% by weight; the acid is in an amount of 0.01 to 5% by weight; said salt is at least one compound selected from the group consisting of ammonium formate, ammonium acetate, ammonium propionate, ammonium butyrate, ammonium valerate, ammonium heptanoate, ammonium laurate, ammonium palmitate, ammonium stearate, ammonium acrylate, ammonium oxalate, ammonium malonate, ammonium maleate, ammonium fumarate, ammonium citraconate, ammonium succinate, ammonium adipate, ammonium azelate, ammonium sebacate, ammonium benzoate, ammonium toluate, ammonium phthalate, ammonium trimellitate, ammonium pyromellitate, monomethylamine formate, dimethylamine formate, triethylamine formate, monomethylamine acetate, dimethylamine acetate, trimethylamine acetate, monoethylamine acetate, diethylamine acetate, triethylamine acetate, monomethylamine benzoate, dimethylamine benzoate, trimethylamine benzoate, monoethylamine benzoate, diethylamine benzoate, triethylamine benzoate, ethanolamine formate, ethanolamine acetate, ethanolamine propionate and ethanolamine benzoate;
said salt is in an amount of 1 to 50% by weight.

18. A process for producing a semiconductor device which comprises the steps of forming a prescribed resist pattern on a semiconductor substrate equipped on the surface thereof with an insulating film layer; forming a via hole by dry etching using said resist pattern as a mask; then removing said resist pattern by effecting an ashing treatment by means of oxygen plasma or a wet treatment by resist-stripper; and thereafter effecting an cleaning treatment by the use of the cleaning liquid as set forth in claim 1, 5, 9, or 11.

19. The process for producing a semiconductor device according to claim 18 wherein said cleaning treatment is effected for removing a deposit polymer formed and stuck to the inside and periphery of a via hole.

20. The process for producing a semiconductor device according to claim 18 wherein said cleaning treatment is effected for removing a deposit polymer formed and stuck to the inside and periphery of via hole, said via hole being formed in the insulating layer including a Spin On Glass layer.

21. A process for producing a semiconductor device which comprises the steps of forming a prescribed resist pattern on a semiconductor substrate equipped on the surface thereof with a metallic electroconductive film layer; forming metallic wiring by dry etching using said resist pattern as a mask; then removing said resist pattern by effecting an ashing treatment by means of oxygen plasma or a wet treatment by resis-stripper; and thereafter effecting an cleaning treatment by the use of the cleaning liquid as set forth in claim 1, 5, 9, or 11.

22. The process for producing a semiconductor device according to claim 21 wherein the metallic electroconductive film layer comprises at least one member selected from the group consisting of tungsten, a tungsten alloy, titanium, a titanium alloy, a titanium/tungsten alloy, titanium nitride, aluminum and an aluminum alloy.

23. The process for producing a semiconductor device according to claim 21 wherein said cleaning treatment is effected for the purpose of removing a deposit polymer formed and stuck to a side wall of the electroconductive film layer.

24. The process for producing a semiconductor device according to claim 18 wherein the ashing treatment by means of oxygen plasma is effected by adding fluorine gas or a fluorine compound gas to the oxygen.

25. A process for producing a semiconductor device which comprises the steps of forming a prescribed resist pattern on a semiconductor substrate equipped on the surface thereof with an insulating film layer; forming a via hole by dry etching using said resist pattern as a mask; then removing said resist pattern by effecting an ashing treatment by means of oxygen plasma or a wet treatment by resist-stripper; and thereafter effecting an cleaning treatment by the use of the cleaning liquid as set forth in claim 2.

26. The process for producing a semiconductor device according to claim 25 wherein said cleaning treatment is effected for removing a deposit polymer formed and stuck to the inside and periphery of a via hole.

27. The process for producing a semiconductor device according to claim 25 wherein said cleaning treatment is effected for removing a deposit polymer formed and stuck to the inside and periphery of via hole, said via hole being formed in the insulating layer including a Spin On Glass layer.

28. A process for producing a semiconductor device which comprises the steps of forming a prescribed resist pattern on a semiconductor substrate equipped on the surface thereof with a metallic electroconductive film layer; forming metallic wiring by dry etching using said resist pattern as a mask; then removing said resist pattern by effecting an ashing treatment by means of oxygen plasma or a wet treatment by resis-stripper; and thereafter effecting an cleaning treatment by the use of the cleaning liquid as set forth in claim 2.

29. The process for producing a semiconductor device according to claim 28 wherein the metallic electroconductive film layer comprises at least one member selected from the group consisting of tungsten, a tungsten alloy, titanium, a titanium alloy, a titanium/tungsten alloy, titanium nitride, aluminum and an aluminum alloy.

30. The process for producing a semiconductor device according to claim 28 wherein said cleaning treatment is effected for the purpose of removing a deposit polymer formed and stuck to a side wall of the electroconductive film layer.

31. The process for producing a semiconductor device according to claim 28 wherein the ashing treatment by means of oxygen plasma is effected by adding fluorine gas or a fluorine compound gas to the oxygen.

32. The process for producing a semiconductor device according to claim 21 wherein the ashing treatment by means of oxygen plasma is effected by adding fluorine gas or a fluorine compound gas to the oxygen.

33. The process for producing a semiconductor device according to claim 25 wherein the ashing treatment by means of oxygen plasma is effected by adding fluorine gas or a fluorine compound gas to the oxygen.

* * * * *